United States Patent

Verkuil et al.

[11] Patent Number: 5,594,247
[45] Date of Patent: Jan. 14, 1997

[54] APPARATUS AND METHOD FOR DEPOSITING CHARGE ON A SEMICONDUCTOR WAFER

[75] Inventors: Roger L. Verkuil, Wappinger Falls, N.Y.; Gregory S. Horner, Solon; Thomas G. Miller, Shaker Hts., both of Ohio

[73] Assignee: Keithley Instruments, Inc., Cleveland, Ohio

[21] Appl. No.: 499,326

[22] Filed: Jul. 7, 1995

[51] Int. Cl.$^6$ .................................................. H01T 19/04
[52] U.S. Cl. ........................... 250/326; 250/324; 361/224
[58] Field of Search ..................................... 250/326, 325, 250/324; 361/229; 355/225

[56] References Cited

U.S. PATENT DOCUMENTS

| | | | |
|---|---|---|---|
| Re. 29,918 | 2/1979 | Verkuil | 324/158 D |
| 3,206,674 | 9/1965 | Thuy et al. | 324/158 |
| 3,456,109 | 7/1969 | Gawron | 250/326 |
| 3,748,579 | 7/1973 | Henry et al. | 324/158 D |
| 4,049,343 | 9/1977 | Hermanson | 355/3 P |
| 4,464,627 | 8/1984 | Munakata et al. | 324/158 R |
| 4,542,434 | 9/1985 | Gehlke et al. | 361/231 |
| 4,544,887 | 10/1985 | Kamieniecki | 324/158 R |
| 4,563,642 | 1/1986 | Munakata et al. | 324/158 D |
| 4,599,558 | 7/1986 | Castellano, Jr. et al. | 324/158 R |
| 4,663,526 | 5/1987 | Kamieniecki | 250/315.3 |
| 4,780,680 | 10/1988 | Reuter et al. | 324/455 |
| 4,792,680 | 12/1988 | Lang et al. | 250/325 |
| 4,809,127 | 2/1989 | Steinman et al. | 361/213 |
| 4,812,756 | 3/1989 | Curtis et al. | 324/158 R |
| 4,816,755 | 3/1989 | Look et al. | 324/158 R |
| 4,827,212 | 5/1989 | Kamieniecki | 324/158 R |
| 4,827,371 | 5/1989 | Yost | 361/213 |
| 4,873,436 | 10/1989 | Kamieniecki et al. | 250/315.3 |
| 4,891,584 | 1/1990 | Kamieniecki et al. | 324/158 R |
| 4,901,194 | 2/1990 | Steinman et al. | 361/213 |
| 4,951,172 | 8/1990 | Steinman et al. | 361/213 |
| 4,956,603 | 9/1990 | Russo | 324/158 D |
| 5,025,145 | 6/1991 | Lagowski | 250/211 J |
| 5,055,963 | 10/1991 | Partridge | 361/231 |
| 5,087,876 | 2/1992 | Reiss et al. | 324/158 D |
| 5,091,691 | 2/1992 | Kamieniecki et al. | 324/158 R |
| 5,216,362 | 6/1993 | Verkuil | 324/158 D |
| 5,266,892 | 11/1993 | Kimura | 324/158 D |
| 5,343,293 | 8/1994 | Berger et al. | 356/369 |

FOREIGN PATENT DOCUMENTS 122982  11/1984  U.S.S.R. .

OTHER PUBLICATIONS

B. H. Yun, "Direct Measurement of Flat–Band Voltage in MOS by Infared Excitation", (Received 25 May 1972), pp. 194–195.
R. G. Vyverberg, "VII. Charging Photoconductive Surfaces", Xerography and Related Processes, pp. 201–206.
"Measuring Work Functions of 'Dirty' Surfaces With a Vibrating Capacitive Probe", Langley Research Center, Hampton, Virginia.
R. B. Comizzoli, "Uses of Corona Discharges in the Semiconductor Industry", J. Electrochem. Soc.: Solid–State Science and Technology, Feb. 1987, pp. 424–429.
P. Edelman, "New Approach to Measuring Oxide Charge and Mobile Ion Concentration", Optical Characterization Techniques for High–Performance Microelectronic Device Manufacturing, SPIE vol. 2337, pp. 154–164.

Primary Examiner—Jack I. Berman
Attorney, Agent, or Firm—Pearne, Gordon, McCoy & Granger

[57] ABSTRACT

A conductive screen is placed between a corona gun and the surface of a semiconductor wafer. The charge deposited on the wafer by the gun is controlled by a potential applied to the screen. A chuck orients the wafer in close proximity to the screen. A desired charge is applied to the wafer by first applying a surplus of one charge to the wafer and then depositing an opposite polarity charge until the potential of the wafer equals the potential of the screen.

17 Claims, 1 Drawing Sheet

APPARATUS AND METHOD FOR DEPOSITING CHARGE ON A SEMICONDUCTOR WAFER

BACKGROUND OF THE INVENTION

The present invention relates to the measurement of semiconductor wafer characteristics and, more particularly, to the deposition of a desired charge upon the surface of such a wafer.

In order to perform various tests to characterize the electrical parameters and quality of semiconductor wafers, it is desirable to be able to produce uniform charge densities on the surface of the wafer.

For example, it is common to rinse a wafer in water to remove any charge that has accumulated on the oxide layer formed on the surface of the wafer.

Such a rinsing entails not only the rinsing step, but also, a drying step. This increases the chances for contamination and damage of the wafer. In addition, the drying process may reintroduce charge gradients.

SUMMARY OF THE INVENTION

One object of the present invention is to provide an apparatus to produce a uniform charge on the surface of a semiconductor wafer.

Another object is to provide an apparatus that deposits a desired amount of charge on the surface of the semiconductor wafer.

These and other objects of the present invention are achieved in a best mode embodiment by an apparatus which includes an ion source, a conductive screen between the source and the surface, and a screen potential control for applying a desired potential to the screen. The screen has a plurality of apertures.

The desired charge is deposited on the wafer by depositing a first polarity charge on the wafer to provide a surplus of the first polarity charge, applying the desired potential to the screen, and depositing a second polarity charge on the wafer until the wafer surface has a potential equal to the desired potential.

DESCRIPTION OF THE PREFERRED EMBODIMENTS

Figure 1:
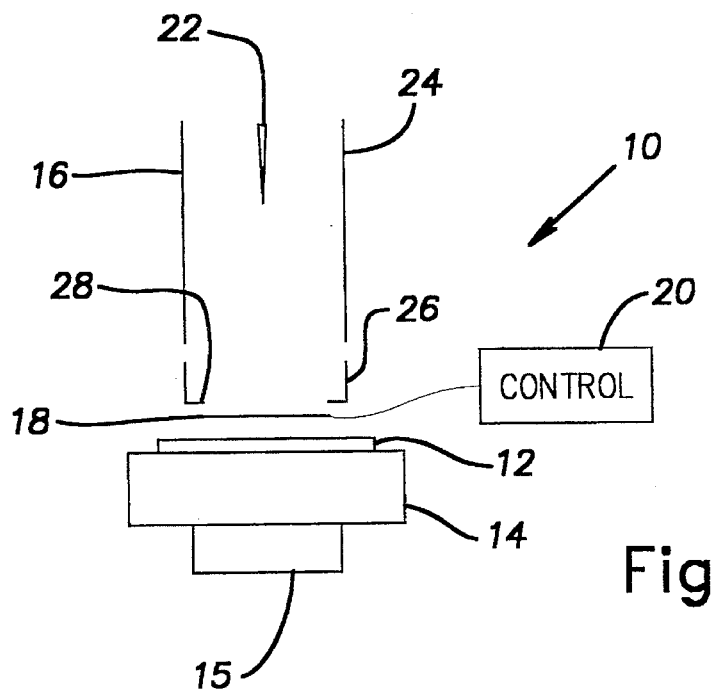
FIG. 1 is a schematic diagram of a side elevation view of an apparatus according to the invention.

Referring to FIG. 1, an apparatus 10 for depositing a desired charge on a surface of a semiconductor wafer 12 includes a chuck 14, an ion source 16, a screen 18 and a potential control 20.

In the preferred embodiment, the chuck 14 holds the wafer 12 with vacuum and the chuck 14 is mounted on a translation stage 15 for moving the wafer 12 in the horizontal plane with respect to the ion source 16 and the screen 18. It is of course possible to make the chuck stationary and to move the ion source 16 and the screen 18 instead, or to use any other configuration that produces the desired relative movement between the wafer 12, and the ion source 16 and screen 18.

Similarly, the ion source 16 and the screen 18 may be mounted on a vertical positioning stage for adjusting the distance between the wafer 12 and the screen 18. The screen 18 may be, for example, adjusted to be from 5–10 mils from the surface of the wafer 12.

The potential control 20 is connected to the screen 18 to establish a desired potential on the screen 18.

The ion source 16 may include, for example, one or more tungsten needles 22 connected to an unshown high voltage (6–9 KV, the polarity of the ions determined by the polarity of the high voltage). The needle 22 is surrounded by a cylindrical upper electrode 24 connected to an unshown high voltage (3 KV). A cylindrical mask electrode 26 with a partially closed end having a circular opening 28 is connected to an unshown high voltage (1.5 KV).

Figure 2:
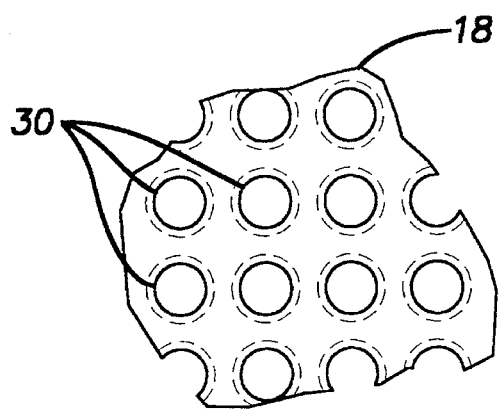
FIG. 2 is a partial enlarged plan view from above of a screen according to the invention.
Figure 3:
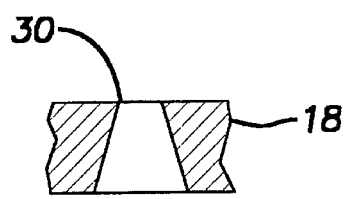
FIG. 3 is a cross sectional view through one of the apertures of the screen of FIG. 2.

Referring to FIG. 2, the screen 18 may be, for example, an 8 mils thick stainless steel sieve With holes 30 having a nominal diameter of 9 mils on 15 mils centers. The screen 18 has a surface slightly larger than the opening 28. In the preferred embodiment, the holes 30 flare towards the wafer 12 (see FIG. 3). For example, the flared diameter may be at least ten percent greater than the entrance diameter on the ion source side.

In operation, the ion source 16 provides ions that move toward the wafer 12. Many of the ions are collected by the screen 12, but initially others travel through the holes 30 and are deposited on the oxide layer of the wafer 12.

As the surface charge of the wafer increase (or decreases depending on the polarity of the ions) the surface potential of the wafer 12 approaches that of the screen 12. When the potential of the screen 12 and the wafer 12 are the same, no more ions pass through the holes 30, thus the potential of the screen 18 controls the charge deposited on the wafer 12. By use of the potential control 20, the desired charge can be established on the wafer 12.

In order to remove all initial charge from the wafer 12, the apparatus 10 is first be used to charge the wafer 12, for example, to a high positive potential with positive ions and when the ion source 16 switched to negative ions and the screen potential set to 0 volts. The negative ions flow through the holes 30 until the potential of the wafer 12 is 0 volts also.

A similar method is used to establish other surface charge levels on the wafer 12. Starting with positive ions, sufficient positive charge is deposited on the surface of the wafer 12 to ensure that all of the desired area has a potential that is greater than the desired potential. Then, with the potential of the screen 18 set to the desired potential, negative ions are deposited until the potential of the wafer 12 equals the screen potential.

Alternatively, starting with negative ions, sufficient negative charge is deposited on the surface of the wafer 12 to ensure that all of the desired area has a potential that is less than the desired potential. Then, with the potential of the screen 18 set to the desired potential, positive ions are deposited until the potential of the wafer 12 equals the screen potential.

The initial charging of the surface of the wafer 12 is done to ensure that there is a surplus of charges with a polarity opposite to that of the ions used to achieve the desired potential in What is essentially a subtraction process. In the preferred embodiment, the polarity of the initial ions are chosen to match the polarity of the desired potential.

It is also possible to supply the ion source 16 with an alternating current. This allows the initial charging of the surface of the wafer to be skipped because both subtraction and addition of charge takes place on each cycle of the current until the potential of the wafer 12 and the screen 18 are equal. This method has the disadvantage that the polarity of the ions is only correct half the time, resulting in a substantial increase in the time required to reach the desired potential.

In the preferred embodiment, the wafer 12 is linearly translated in a horizontal plane under the ion source 16 and the screen 18 until all the desired area of the surface of the wafer 12 is charged to the desired potential.

It has been found that superior charge uniformity is obtained if a small circular translation is imposed on the basic linear translations used to cover the desired area of the wafer 12. This circular translation may, for example, have a horizontal radius of 5–50 mils about points on the linear translation.

It is also possible to use other small dithering movements instead of the circular translation. Whether circular or otherwise, the dithering should ensure that all of the desired area of the wafer 12 has ample exposure to the apertures 30.

It is believed that the taper of the holes 30 provides superior performance because as ionized molecules pass through the holes, the field from the charges already deposited on the wafer 12 has more room to disperse the newly arriving charges.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. An apparatus for depositing a desired charge on a surface of a semiconductor wafer, said apparatus comprising:
   an ion source;
   a conductive screen between said source and said surface, said screen having a plurality of apertures, wherein said apertures flare toward said surface; and
   a screen potential control for applying a desired potential to said screen.

2. An apparatus according to claim 1, wherein said ion source includes a needle-shaped electrode for providing ions of a particular polarity from the tip thereof in response to an ionizing potential applied thereto.

3. An apparatus according to claim 1, further comprising means to dither said wafer with respect to said screen.

4. An apparatus according to claim 1, wherein said screen is oriented between 5 and 10 mils from said surface.

5. An apparatus according to claim 1, wherein said apertures flare at least ten percent.

6. An apparatus according to claim 1, wherein said apertures are substantially circulars.

7. An apparatus according to claim 6, wherein said apertures are substantially 9 mils in diameter and substantially 15 mils on centers.

8. A method for depositing a desired charge on a surface of a semiconductor wafer, said method comprising:
   providing an ion source;
   providing a conductive screen between said source and said surface, said screen having a plurality of apertures, wherein said apertures flare toward said surface;
   providing a screen potential control for applying a desired potential to said screen;
   depositing a first polarity charge on said wafer to provide a surplus of said first polarity charge;
   applying said desired potential to said screen; and
   depositing a second polarity charge on said wafer until said wafer has a potential equal to said desired potential.

9. A method according to claim 8, further comprising dithering said wafer with respect to said screen.

10. A method for depositing a desired charge on a surface of a semiconductor wafer, said method comprising:
    providing an alternating polarity ion source;
    providing a conductive screen between said source and said surface, said screen having a plurality of apertures, wherein said apertures flare toward said surface;
    providing a screen potential control for applying a desired potential to said screen;
    applying said desired potential to said screen; and p1 depositing charge on said wafer until said wafer has a potential equal to said desired potential.

11. An apparatus for depositing a desired charge on a surface of a semiconductor wafer, said apparatus comprising:
    an ion source;
    a conductive screen between said source and said surface, said screen having a plurality of apertures;
    a screen potential control for applying a desired potential to said screen;
    means to linearly translate said wafer with respect to said apparatus in a linear path to deposit charge on a desired portion of said surface; and
    means to dither said wafer with respect to said apparatus about said linear path.

12. An apparatus according to claim 11, wherein said ion source includes a needle-shaped electrode for providing ions of a particular polarity from the tip thereof in response to an ionizing potential applied thereto.

13. An apparatus according to claim 11, wherein said screen is oriented between 5 and 10 mils from said surface.

14. An apparatus according to claim 11, wherein said apertures flare toward said surface.

15. An apparatus according to claim 14, wherein said apertures flare at least ten percent.

16. An apparatus according to claim 11, wherein said apertures are substantially circular.

17. An apparatus according to claim 16, wherein said apertures are substantially 9 mils in diameter and substantially 15 mils on centers.

* * * * *

UNITED STATES PATENT AND TRADEMARK OFFICE
CERTIFICATE OF CORRECTION

PATENT NO. : 5,594,247
DATED : January 14, 1997
INVENTOR(S) : Roger L. Verkuil, et al.

It is certified that error appears in the above-indentified patent and that said Letters Patent is hereby corrected as shown below:

Delete "when" and insert --then-- in Column 2, Line 42.

Delete "circulars" and insert --circular-- in Claim 6, Column 3, Line 58.

Signed and Sealed this

Thirteenth Day of May, 1997

Attest:

BRUCE LEHMAN

*Attesting Officer*  *Commissioner of Patents and Trademarks*